United States Patent [19]

Kim

[11] Patent Number: 5,244,829
[45] Date of Patent: Sep. 14, 1993

[54] ORGANOMETALLIC VAPOR-PHASE EPITAXY PROCESS USING (CH$_3$)$_3$AS AND CCL$_4$ FOR IMPROVING STABILITY OF CARBON-DOPED GAAS

[75] Inventor: Tae S. Kim, Dallas, Tex.

[73] Assignee: Texas Instruments Incorporated, Dallas, Tex.

[21] Appl. No.: 910,934

[22] Filed: Jul. 9, 1992

[51] Int. Cl.$^5$ ............................................. H01L 21/20
[52] U.S. Cl. ................................ 437/104; 437/133; 437/126; 437/107; 148/DIG. 110
[58] Field of Search ............... 437/133, 104, 107, 126; 148/DIG. 110

[56] References Cited

U.S. PATENT DOCUMENTS

| | | | |
|---|---|---|---|
| 4,935,381 | 6/1990 | Speckman et al. | 437/107 |
| 4,999,223 | 3/1991 | Kanjolia et al. | 437/133 |
| 5,116,455 | 5/1992 | Daly | 437/133 |
| 5,168,077 | 12/1992 | Ashizawa et al. | 437/107 |
| 5,173,445 | 12/1992 | Ando et al. | 437/107 |

OTHER PUBLICATIONS

Hana et al., "Very High Carbon Incorporation in Metalorganic Vapor Phase Epitaxy of Heavily Doped P-type GaAs"; Appl. Phys. Lett. 58(2), Jan. 1991, pp. 164–166.

Enquist; "P-Type Doping Limit of Carbon in Organometallic Vapor Phase Epitaxial Growth of GaAs Using Carbon Tetrachloride"; Appl. Phys. Lett; vol. 57, No. 22; Nov. 1990; pp. 2348–2350.

Cunningham; "Carbon Tetrachloride Doped Al$_x$Ga$_{1-x}$As Grown by Metalorganic Chemical Vapor Deposition"; Appl. Phys. Lett. 56(9); 1990, p. 836.

Hobson et al.; "Comparision of Gallium and Arsenic Precursors for GaAs Carbon Doping by Organometallic Vapor Phase Epitaxy Using CCl$_4$"; Appl. Phys. Lett. 60(26), Jun. 1992, p. 3259.

Kuech et al.; "Controlled Carbon Doping of GaAs by Metalorganic Vapor Phase Epitaxy"; Appl. Phys. Lett. 53(14); 1988, pp. 1317–1319.

Primary Examiner—Brian E. Hearn
Assistant Examiner—Trung Dang
Attorney, Agent, or Firm—Richard A. Stoltz; Richard Donaldson; Jay Cantor

[57] ABSTRACT

The use of trimethylarsine in place of tertiary butyl arsine for low pressure organometallic vapor phase epitaxy of GaAs:C to enhance the carbon doping efficiency of CCl$_4$. The hole concentration is three times higher with trimethylarsine then with tertiary butyl arsine in the layer grown under similar conditions. As a result, higher growth temperatures can be used with trimethyl arsine, yielding more stable carbon doping. Annealing at 650° C. for 5 minutes does not degrade the trimethyl arsine-grown layers while the tertiary butyl arsine-grown layer shows decreases in both hole concentration and mobility. Also a high level of hydrogen atoms is detected in tertiary butyl arsine-grown GaAs:C. The hydrogen level is about 30 times lower in the layers grown with trimethyl arsine. The reduced hydrogen concentration is an added advantage of using trimethyl arsine since hydrogen is known to neutralize acceptors in GaAs to reduce the carrier concentrations.

20 Claims, 1 Drawing Sheet

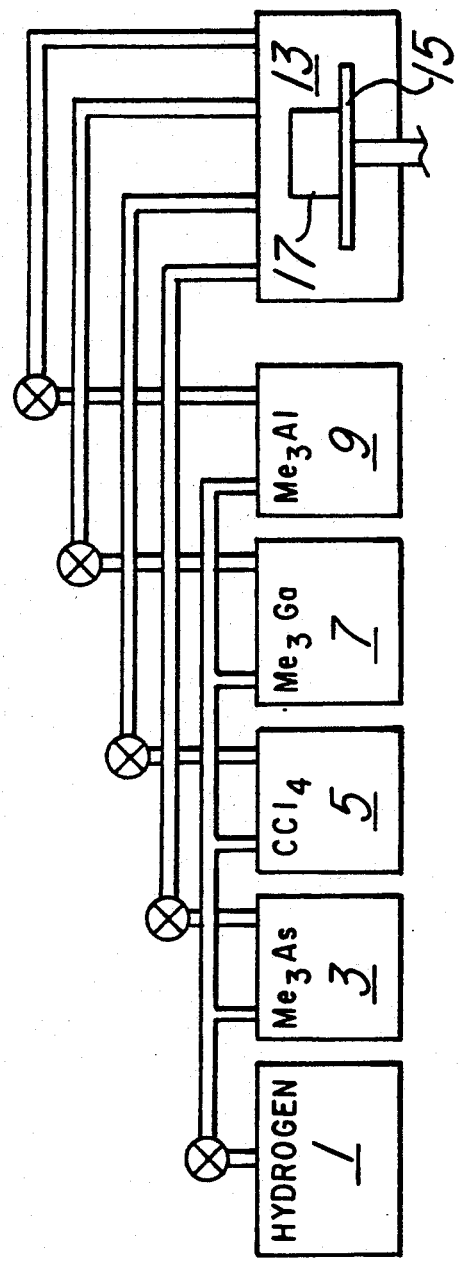

ORGANOMETALLIC VAPOR-PHASE EPITAXY PROCESS USING (CH$_3$)$_3$AS AND CCL$_4$ FOR IMPROVING STABILITY OF CARBON-DOPED GAAS

BACKGROUND OF THE INVENTION

1. Field of the Invention

This invention relates to doping of group III-V semiconductor compounds and, more specifically, to improvements in doping stability of carbon-doped group III-V semiconductor compounds.

2. Brief Description of the Prior Art

Recently, carbon has become a widely used p-type dopant in organometallic vapor-phase epitaxy (OMVPE, also often called MOVPE, MOCVD and OMCVD) of GaAs. Due to its low diffusivity, even at high concentrations, carbon is an ideal dopant for the device structures which require heavily doped p-type layers such as AlGaAs/GaAs heterojunction bipolar transistors (HBT) and vertical field-effect transistors (VFET). This is set forth in an article of B. T. Cunningham et al., *Applied Physics Letters*, Vol 54, pg. 1905 (1989).

Two most widely used methods of carbon doping in OMVPE are (1) adding CCl$_4$ as an intentional dopant source and (2) using trimethylarsine ((CH$_3$)$_3$As or Me$_3$As) as an arsenic and carbon source without any intentional dopant source. These are set forth in articles of P. M. Enquist, *Applied Physics Letters*, Vol. 57, pg. 2348 (1990) and T. Kobayashi et al., *Journal of Crystal Growth*, Vol. 102, page 183 (1990). Both methods can yield hole concentrations in excess of $1 \times 10^{20}/cm^3$ in GaAs, but the doping concentration depends upon many growth parameters, such as growth temperature, ratio of group III to group V elements and growth rates. In the second method, the growth temperature is the most convenient parameter to vary the doping concentrations, as lower growth temperatures yield higher doping concentrations. When CCl$_4$ is used, the doping concentration can be varied to a certain extent by changing the CCl$_4$ flow, but to minimize the CCl$_4$ flow, which is potentially harmful to the reactor, lower growth temperatures ($\leq 600°$ C.) are desirable for higher doping concentrations. On the other hand, using low growth temperatures ($\leq 600°$ C.) is not desirable since the electrical and optical properties of carbon-doped GaAs (GaAs:C) degrade after heat treatment. Annealing of GaAs:C reduces the hole concentration and mobility and photoluminescence intensity as set forth in an article by M. C. Hanna et al., *Applied Physics Letters*, Vol. 59, page 2001 (1991). Such a degradation is particularly troublesome for heavily carbon-doped GaAs since growth temperatures used for such high doping levels may not be high enough for the growth of subsequent layers. For example, growing an AlGaAs emitter layer after a heavily carbon-doped base layer of an AlGaAs/GaAs HBT may require raising the growth temperature substantially, the elevated temperature being sufficiently high to degrade the electrical properties of the base layer. Also, the device fabrication procedure frequently requires high temperature processing steps, such as overgrowth and annealing. These processing steps can also degrade the electrical properties of the base layer.

SUMMARY OF THE INVENTION

In accordance with the present invention, a carbon doping method is provided for group III-V semiconductor compounds and particularly GaAs in which arsine (or t-BuAsH$_2$), which is generally used, is replaced by an atomic hydrogen-free arsenic source and preferably Me$_3$ or triethylarsine (Et$_3$As) to enhance the doping efficiency of the CCl$_4$ (by eliminating the atomic hydrogen generated by decomposition of arsine (or t-BuAsH$_2$)). The CCl$_4$ can be replaced by CCl$_3$H, CCl$_2$H$_2$ or CClH$_3$ and can probably be replaced by the corresponding halides of bromine and iodine and halides with more than one carbon atom. It is desirable to minimize the hydrogen in the system to minimize the production of hydrocarbons and thereby to maximize the amount of free carbon available for doping the group III-V semiconductor material. Accordingly, CCl$_4$ is preferred. More stable carbon doping is achieved by using this method which allows high growth temperatures. The invention is useful for AlGaAs in addition to GaAs as well as to other group III-V semiconductor materials. Also, the method is useful for any applications which require heavily doped p-type AlGaAs.

A goal of the invention herein is to minimize the amount of hydrogen in the system. For this reason, the hydrogen carrier gas normally used which carries the CCl$_4$, trimethyl arsine and trimethyl gallium (Me$_3$Ga) (or which carries other group III-V semiconductor compound precursor materials and carbon containing dopant) into the reactor for deposition of carbon-doped GaAs (or other carbon-doped group III-V semiconductor compound), can be replaced by a carrier gas which is inert to the materials supplied to and formed in the reaction chamber, such as helium, argon and the like.

BRIEF DESCRIPTION OF THE DRAWING

The FIGURE is a schematic diagram of a standard reactor system for formation of carbon doped group III-V semiconductor materials in accordance with the present invention.

DESCRIPTION OF THE PREFERRED EMBODIMENT

Referring now to the FIGURE, there is shown a typical reactor system which provides carbon-doped group III-V semiconductor materials in accordance with the present invention. The system includes a plurality of valve controlled tanks 1, 3, 5, 7, 9, each tank containing one of a precursor gas required in the reaction or a carrier gas. In the system shown, there is a tank 1 containing the hydrogen carrier gas (which can be replaced by a gas which is inert to the materials and reaction products of the fabrication process), a tank 3 containing trimethyl arsine, a tank 5 containing carbon tetrachloride, a tank 7 containing trimethyl gallium and a tank 9 containing trimethyl aluminum. Hydrogen gas from the tank 1 is bubbled through the liquid in one or more of the tanks 3, 5, 7 and 9, as required, by selective opening and/or closing the valves associated with the respective tanks. The hydrogen gas acts as a carrier and carries the selected compounds in gaseous form into the reaction chamber 13. The reaction chamber contains a heatable pedestal 15 on which is disposed, for example, a GaAs substrate 17 which can be heated by the pedestal. The reaction chamber 13 is evacuated to a pressure of about 10 to about 760 Torr and preferably about 60

Torr or 80KPa and the temperature therein is raised to 450° C. to 800° C. and preferably 610° C. (450° C. to 600° C. for carbon doping).

Assuming that carbon-doped GaAs is to be formed on the GaAs substrate 17, the valves on the tanks 1, 3, 5 and 7 are opened to provide a predetermined flow rate for each of the gases, these gases passing through the bubbler 11 and into the reaction chamber 13. The gases react in the chamber to form GaAs:C which deposits on the GaAs substrate 17. The HCl gas which is also formed as well as any hydrocarbon gases which may be formed are expelled from the chamber.

In the event a carbon-doped ternary compound is to be provided, the valve for the tank 9 is also opened to provide a predetermined flow rate therefrom into the reaction chamber 13 to provide carbon-doped AlGaAs on the GaAs substrate 17.

In a specific example, the growth was performed in an EMCORE GS-3200 OMVPE reactor, which is a low pressure (8 kPa), rotatingdisk vertical reactor using trimethylgallium ($Me_3Ga$) and either tertiarybutylarsine (t-BuAsH instead of arsine) or $Me_3As$. The epitaxial layers comprise about 400 nm thick carbon-doped and 400 nm thick undoped GaAs buffer layers which were grown on semiinsulating (100) GaAs substrates misoriented 2° toward a (110) plane.

Carbon doping efficiency was determined in t-$BuAsH_2$- and $Me_3As$-grown GaAs by growing layers under similar growth conditions. The flow rates of $Me_3Ga$, $CCl_4$, t-$BuAsH_2$ and $Me_3As$ were 30, 8, 100 and 100 μmole/minute, respectively, for carbon-doped layers grown at 610° C. Then the stability of carbon doping was compared by growing layers with similar hole concentrations (about $1.2 \times 10^{20}/cm^3$) and subjecting them to similar annealing conditions. A high hole concentration was chosen because the degradation is more pronounced at high hole concentration. The flow rates of $Me_3Ga$, $CCl_4$, t-$BuAsH_2$ and $Me_3As$ were 60, 26, 50 and 100 μmole/minute, respectively, during the growth of carbon-doped layers. The growth temperature of t-$BuAsH_2$-grown GaAs was lowered to 550° C. to achieve the desired doping concentrations, while that of $Me_3As$-grown layers remained at 610° C. Some of the layers were subjected to post-growth annealing in the growth chamber for 5 minutes at 650° C., which is a typical growth temperature of AlGaAs. During annealing, arsenic overpressure was maintained by either t-$BuAsH_2$ or $Me_3As$ to examine the effect of atomic hydrogen generated by the decomposition of t-$BuAsH_2$. The flow rates of t-$BuAsH_2$ and $Me_3As$ were both 240 μmole/minute during annealing. Although it was found that higher growth rates increased the doping efficiency, the growth rate was limited to less than 100 nm/minute because the reliable growth of the thin ($\leq 100$ nm) base layers of HBT structures is difficult with high growth rates. The carrier concentrations were measured by Hall effect measurements using a Van der Pauw geometry and atomic concentrations of carbon and hydrogen were measured using a secondary ion mass spectroscopy (SIMS) system.

As can be seen from Table 1, which summarizes the results of Hall effect measurements on the t-$BuAsH_2$ and $Me_3As$-GaAs:C layers grown under similar condition, the growth rate was 30% lower with $Me_3As$ than with t-$BuAsH_2$, presumably due to the site blocking of $Me_3As$. The carbon-doping efficiency is about three times higher when $Me_3As$ is used instead of t-$BuAsH_2$ which generated atomic hydrogen upon decomposition.

It is believed that the atomic hydrogen at the growth surface generated from decomposition of t-$BuAsH_2$ (or $AsH_3$) plays an important role in determining the doping efficiency of $CCl_4$. The atomic hydrogen may react with $CCl_4$, forming volatile species as discussed in an article of M. C. Hanna et al., *Applied Physics Letters*, Vol. 58, page 164 (1991).

When t-$BuAsH_2$ is replaced with $Me_3As$, the additional methyl radicals from $Me_3$ may take chlorine atoms from $CCl_4$, leaving carbon atoms behind. Although $Me_3As$ alone can yield carbon doping without $CCl_4$, the hole concentration was significantly lower, indicating that the majority of carbon is from $CCl_4$ under these growth conditions. The growth temperature is required to be lowered to 550° C. to achieve similar hole concentrations with $Me_3As$ alone. Arsine was not used for safety purposes, however $AsH_3$-grown GaAs:C should behave similarly to t-$BuAsH_2$-grown GaAs:C since $AsH_3$ also generates atomic hydrogen upon decomposition.

TABLE 1

| As/C Sources | Hole Concentration ($10^{18}/cm^3$) | Mobility ($cm^2/Vs$) |
| --- | --- | --- |
| t-$BuAsH_2/CCl_4$ | 15 | 103 |
| $Me_3As/CCl_4$ | 43 | 74 |
| Only $Me_3As$ | 4–6 | — |

Table 2 summarizes the results of Hall-effect and SIMS measurements on the as-grown and annealed GaAs:C layers. The Hall mobility of as-grown GaAs:C is about 15% higher in the $Me_3As$-grown layer than in the t-$BuAsH_2$-grown layer, while the atomic concentration of carbon in the t-$BuAsH_2$-grown layer is almost twice as high as in the $Me_3As$-grown layer. These results suggest that the excess carbon atoms in t-$BuAsH_2$-grown GaAs:C give rise to donor states which compensate the carbon acceptors. Also, a significantly higher level of hydrogen is detected in the t-$BuAsH_2$-grown than in the $Me_3As$-grown layer, indicating that the atomic hydrogen generated by the decomposition of t-$BuAsH_2$ are incorporated in GaAs:C. The hydrogen level in the undoped GaAs buffer layer was grown under the same growth conditions except that the $CCl_4$ was below the SIMS detection limit, indicating that the hydrogen atoms are trapped by the carbon acceptors. It appears that the hydrogen atoms are trapped by forming carbon acceptorhydrogen complexes.

TABLE 2

| Growth | Annealing | Hole Conc. ($10^{19}/cm^3$) | Mobility ($cm^2/Vs$) | C Conc. ($10^{20}/cm^3$) | H Conc. ($10^{19}/cm^3$) |
| --- | --- | --- | --- | --- | --- |
| $Me_3As$ | as grown | 12 | 70 | 2 | 1–2 |
| $Me_3As$ | $Me_3As$ | 12 | 70 | 2 | 2 |
| $Me_3As$ | t-$BuAsH_2$ | 12 | 70 | 2 | 2 |
| t-$BuAsH_2$ | as grown | 12 | 60 | 6 | 40 |
| t-$BuAsH_2$ | t-$BuAsH_2$ | 6 | 45 | 6 | 20 |

Although the hydrogen level in $Me_3As$-grown GaAs:C is thirty times lower than in the t-$BuAsH_2$-grown GaAs:C, the level is five times higher than in the undoped buffer layers (the SIMS detection limit). These results further support the proposition that the presence of carbon acceptors plays an important role in hydrogen incorporation in GaAs during growth. After annealing, the $Me_3As$-grown layer shows virtually no decrease in mobility and carrier concentrations. There are no apparent differences in electrical properties and atomic profiles between the samples annealed under the t-BuAsH$_2$ and Me$_3$As flows. Generation of atomic hydrogen upon the decomposition of t-BuAsH$_2$ does not appear to induce a significant in-diffusion of hydrogen into GaAs under the annealing conditions. Hydrogen concentration in t-BuAsH$_2$-grown GaAs:C decreased by almost a factor of two after annealing. The decrease in hydrogen concentration in the t-BuAsH$_2$-grown GaAs:C after annealing did not result in an increase in hole concentration, but in a significant decrease in both hole concentration and mobility. These results indicate that the degradation of the electrical properties in heavily carbon-doped GaAs is induced by the formation of donor states by the excess carbon atoms. The high levels of hydrogen and carbon atoms detected in t-BuAsH$_2$-grown GaAs:C suggest that some of the carbon acceptors are neutralized by the hydrogen in t-BuAsH$_2$-grown GaAs:C as noted by N. Pan et al., *Applied Physics Letters*, Vol 51, pg. 596 (1987). Since the hydrogen-dopant complexes begin to dissociate at fairly low temperatures ($\leq 250°$ C.), annealing at moderate temperatures in non-hydrogen ambient should increase the carrier concentrations. Such an increase in the carrier concentration in heavily carbon-doped ($\geq 1 \times 10^{20}$/cm$^3$) AlGaAs after annealing has been reported by K. Watanabe et al., *Applied Physics Letters*, Vol. 60, pg. 847 (1992).

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of fabricating a carbon doped layer of a group III-V compound comprising the steps of:
   (a) providing a stream of gaseous atomic hydrogen-free precursors of a predetermined group III-V semiconductor compound and a carbon halide having one carbon atom;
   (b) providing a chamber containing a group III-V substrate; and
   (c) causing said stream to deposit the carbon-doped group III-V compound based upon said precursors on said substrate in said chamber.

2. The method of claim 1 wherein the pressure in said chamber is from about 10 to about 760 and the temperature is from about 450° C. to about 800° C.

3. The method of claim 1 wherein said carbon halide is carbon tetrachloride.

4. The method of claim 2 wherein said carbon halide is carbon tetrachloride.

5. The method of claim 1 wherein said carbon-doped group III-V compound is GaAs and one of said precursors is trimethyl arsine.

6. The method of claim 2 wherein said carbon-doped group III-V compound is GaAs and one of said precursors is trimethyl arsine.

7. The method of claim 3 wherein said carbon-doped group III-V compound is GaAs and one of said precursors is trimethyl arsine.

8. The method of claim 4 wherein said carbon-doped group III-V compound is GaAs and one of said precursors is trimethyl arsine.

9. The method of claim 1 wherein said carbon-doped group III-V compound is GaAs and one of said precursors is trimethyl gallium.

10. The method of claim 2 wherein said carbon-doped group III-V compound is GaAs and one of said precursors is trimethyl gallium.

11. The method of claim 3 wherein said carbon-doped group III-V compound is GaAs and one of said precursors is trimethyl gallium.

12. The method of claim 4 wherein said carbon-doped group III-V compound is GaAs and one of said precursors is trimethyl gallium.

13. The method of claim 5 wherein the other of said precursors is trimethyl gallium.

14. The method of claim 6 wherein the other of said precursors is trimethyl gallium.

15. The method of claim 7 wherein the other of said precursors is trimethyl gallium.

16. The method of claim 8 wherein the other of said precursors is trimethyl gallium.

17. The method of claim 1 wherein said carbon-doped compound is AlGaAs and the precursors thereof are trimethyl arsine, trimethyl gallium and trimethyl aluminum.

18. The method of claim 2 wherein said carbon-doped compound is AlGaAs and the precursors thereof are trimethyl arsine, trimethyl gallium and trimethyl aluminum.

19. The method of claim 3 wherein said carbon-doped compound is AlGaAs and the precursors thereof are trimethyl arsine, trimethyl gallium and trimethyl aluminum.

20. The method of claim 4 wherein said carbon-doped compound is AlGaAs and the precursors thereof are trimethyl arsine, trimethyl gallium and trimethyl aluminum.

* * * * *